United States Patent
Sung et al.

(10) Patent No.: US 11,035,040 B2
(45) Date of Patent: Jun. 15, 2021

(54) SHOWERHEAD AND SUBSTRATE PROCESSING APPARATUS

(71) Applicant: Samsung Electronics Co., Ltd., Suwon-si (KR)

(72) Inventors: Edward Sung, Seoul (KR); Jin Young Bang, Hwaseong-si (KR); Hyuk Kim, Seongnam-si (KR); Sung Il Cho, Seoul (KR)

(73) Assignee: Samsung Electronics Co., Ltd.

( * ) Notice: Subject to any disclaimer, the term of this patent is extended or adjusted under 35 U.S.C. 154(b) by 274 days.

(21) Appl. No.: 16/178,023

(22) Filed: Nov. 1, 2018

(65) Prior Publication Data

US 2019/0323126 A1 Oct. 24, 2019

(30) Foreign Application Priority Data

Apr. 20, 2018 (KR) .......................... 10-2018-0046148

(51) Int. Cl.
*C23C 16/455* (2006.01)
*H01J 37/32* (2006.01)
*C23C 16/44* (2006.01)

(52) U.S. Cl.
CPC .... *C23C 16/45565* (2013.01); *C23C 16/4412* (2013.01); *H01J 37/32449* (2013.01); *H01J 37/32633* (2013.01); *H01J 37/32715* (2013.01); *H01J 2237/3341* (2013.01)

(58) Field of Classification Search
CPC .......... C23C 16/45565; C23C 16/4412; H01J 37/32449; H01J 37/32633; H01J 37/32715; H01J 2237/3341
See application file for complete search history.

(56) References Cited

U.S. PATENT DOCUMENTS

| | | | |
|---|---|---|---|
| 8,366,828 B2 | 2/2013 | Iizuka | |
| 8,758,550 B2 | 6/2014 | Iizuka | |
| 8,869,742 B2 | 10/2014 | Dhindsa et al. | |
| 2009/0229754 A1 | 9/2009 | Iizuka et al. | |
| 2009/0236041 A1 | 9/2009 | Iizuka | |
| 2010/0230051 A1 | 9/2010 | Iizuka | |
| 2016/0083844 A1 | 3/2016 | Nishitani et al. | |

FOREIGN PATENT DOCUMENTS

| | | |
|---|---|---|
| JP | 2009224441 | 10/2009 |
| JP | 4503574 | 4/2010 |
| JP | 5210853 | 3/2013 |
| JP | 5764246 | 6/2015 |
| JP | 2016014185 | 1/2016 |
| KR | 100888652 | 3/2009 |
| KR | 101493254 | 2/2015 |

*Primary Examiner* — Yuechuan Yu
(74) *Attorney, Agent, or Firm* — Myers Bigel, P.A.

(57) ABSTRACT

A showerhead according to an embodiment of the present inventive concept includes an upper plate including a plurality of gas supply passages, a lower plate including a plurality of supply holes and a plurality of exhaust slots formed in a lower surface, and a plurality of partition walls between the upper plate and the lower plate, connected to a plurality of exhaust slots and defining exhaust passages that are open at a side portion of the showerhead.

16 Claims, 11 Drawing Sheets

II-II'

SHOWERHEAD AND SUBSTRATE PROCESSING APPARATUS

CROSS-REFERENCE TO RELATED APPLICATION

This application claims priority to Korean Patent Application No. 10-2018-0046148, filed on Apr. 20, 2018 in the Korean Intellectual Property Office, the disclosure of which is incorporated by reference herein in its entirety.

BACKGROUND

The present inventive concept relates to a showerhead and a substrate processing apparatus.

A substrate processing apparatus, processing a substrate such as a semiconductor wafer, using plasma, is used in a semiconductor manufacturing process. In a substrate processing apparatus, processing operations such as an etching process and a deposition process may be performed using plasma. To this end, a substrate processing apparatus may include a showerhead for supplying a process gas. In recent semiconductor manufacturing processes, substrates such as semiconductor wafers are becoming larger, and process uniformity of the processing operations in the substrates has increased in importance.

SUMMARY

Example embodiments of the present inventive concept are to provide a showerhead and a substrate processing apparatus in which uniformity in a wafer in processing operations is improved.

According to an example embodiment of the present inventive concept, a showerhead includes: an upper plate including a plurality of gas supply passages; a lower plate including a plurality of supply holes and a plurality of exhaust slots defined or formed in a lower surface; and a plurality of partition walls between the upper plate and the lower plate and defining exhaust passages that are open at a side portion of the showerhead.

According to an example embodiment of the present inventive concept, a showerhead includes: an upper plate including a plurality of gas supply passages; a lower plate including a plurality of supply holes and a plurality of exhaust slots defined or formed in a lower surface thereof; and a plurality of partition walls between the upper plate and the lower plate and vertically aligned with the plurality of gas supply passages, the plurality of partition walls defining exhaust passages that are open at a side portion of the showerhead; wherein the plurality of partition walls may include a plurality of vertical supply channels fluidly connected to the plurality of gas supply passages of the upper plate and the plurality of supply holes of the lower plate; and wherein a total area of the plurality of exhaust slots may be larger than a total area of the plurality of supply holes on the lower surface of the lower plate.

According to an example embodiment of the present inventive concept, a substrate processing apparatus includes: a plasma processing chamber; a susceptor in the plasma processing chamber and configured to support a substrate; a showerhead over the susceptor and configured to supply process gas from a lower surface thereof and configured to exhaust residual gas through a side portion thereof; and a plasma confining portion between the susceptor and the showerhead defining a plasma confining region. In this case, the showerhead may include an upper plate including a plurality of gas supply passages, a lower plate including a plurality of supply holes and a plurality of exhaust slots, and a plurality of partition walls between the upper plate and the lower plate defining a plurality of exhaust passages that are open at the side portion of the showerhead and that are in fluid communication with the plurality of exhaust slots; and wherein the plurality of partition walls may each include a plurality of vertical supply channels fluidly connected to the plurality of gas supply passages of the upper plate and the plurality of supply holes of the lower plate.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings. As used herein the expression "and/or" includes any and all combinations of one or more of the associated listed items.

Figure 1:
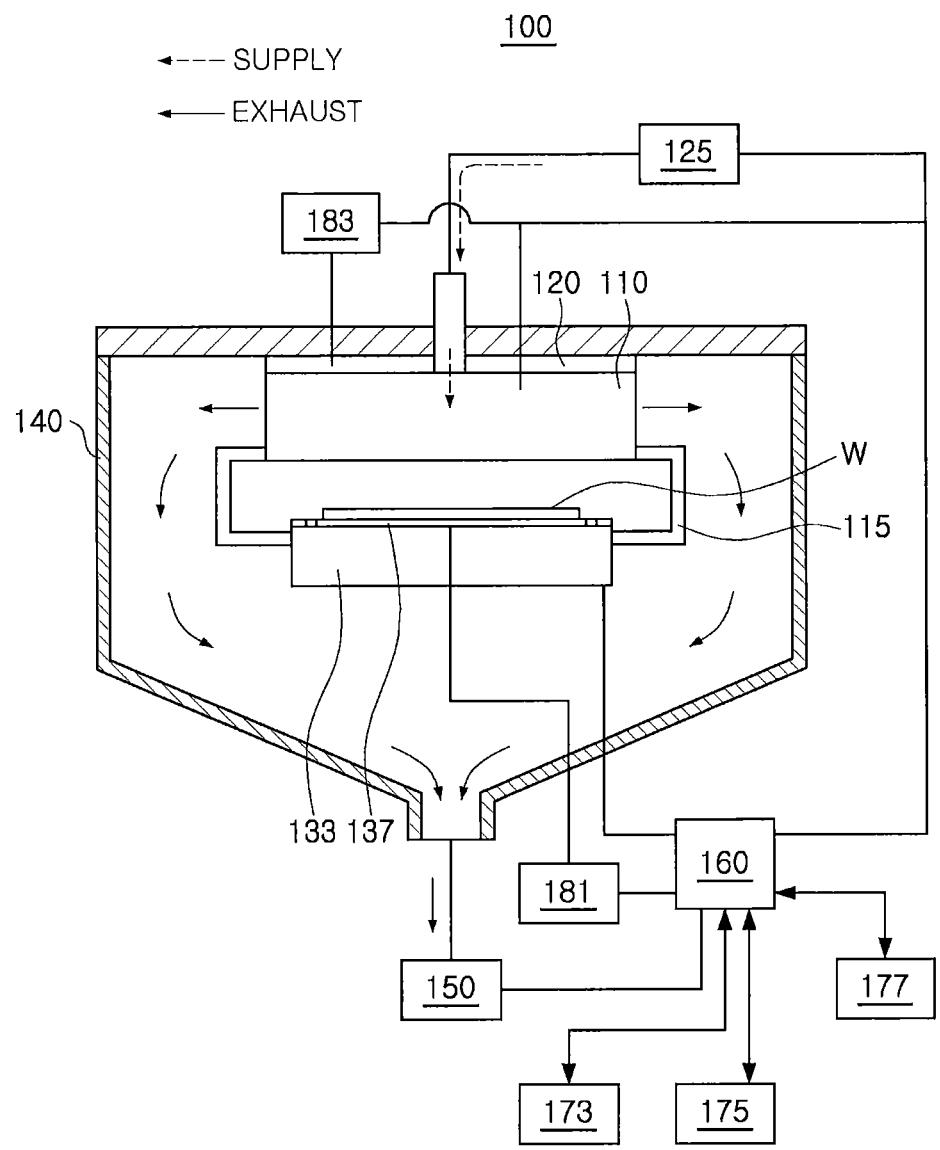
FIG. 1 is a view schematically illustrating a substrate processing apparatus according to an example embodiment of the present inventive concept.

FIG. 1 is a view schematically illustrating a substrate processing apparatus according to an example embodiment of the present inventive concept.

Referring to FIG. 1, a substrate processing apparatus 100 according to an example embodiment may include a showerhead 110, an upper heater 120, a susceptor 133, and an electrostatic chuck 137 within a plasma processing chamber and surrounding by a chamber wall 140.

The electrostatic chuck 137 may be disposed on an upper portion of the susceptor 133, and a substrate W may be located on an upper portion of the electrostatic chuck 137. The substrate W may be or include a semiconductor wafer.

The showerhead 110 may be disposed to face the electrostatic chuck 137 with a predetermined gap therebetween. The showerhead 110 may be provided as an upper electrode and the electrostatic chuck 137 may be provided as a lower electrode.

A C-shaped shroud 115 may be disposed between the showerhead 110 and the susceptor 133, and may be connected to the showerhead 110 and the susceptor 133 to provide or define a plasma confining region. The C-shaped shroud 115 may be referred to as a plasma confining portion.

The showerhead 110 may supply process gas (e.g., etching gas) to the plasma confining region and exhaust residual gas therefrom. The residual gas may include radicals, neutral atoms, etch by-products, and the like.

In this example embodiment, the C-shaped shroud 115 may not have openings to prevent process gas, plasma, or residual gas from being exhausted through a lower portion of the C-shaped shroud 115. The C-shaped shroud 115 may be grounded. Instead, exhaust flowing through the showerhead 110 to the plasma processing chamber may be performed. The exhausted residual gas may ultimately be discharged to the outside through an exhaust port located in a lower portion of a plasma processing chamber.

A gas source 125 may be connected to the showerhead 110 through or via a gas supply line and may supply process gas (e.g., etching gas) to the plasma confining region.

A bias RF source 173, a first excitation RF source 175 and a second excitation RF source 177 may be electrically connected to the susceptor 133 through or via a controller 160 to provide RF power.

An upper temperature controller 183 may control a temperature of the upper heater 120 independently. A lower temperature controller 181 may control a temperature of the electrostatic chuck 137 independently.

A vacuum pump 150 may discharge residual gas discharged to a side portion of the showerhead 110 through an exhaust passage in the showerhead 110 to the outside through the exhaust port located in the lower portion of the chamber wall 140. Further, the vacuum pump 150 may control a pressure in the plasma processing chamber.

The controller 160 may be connected or operatively connected to the gas source 125, the bias RF source 173, the first excitation RF source 175, the second excitation RF source 177, the lower temperature controller 181, the upper temperature controller 183, and the vacuum pump 150. The controller 160 may control an inflow of etching gas to the plasma confining region, a generation of RF power, a temperature of the showerhead and the substrate, a pressure of the chamber, and the like.

Figure 2:
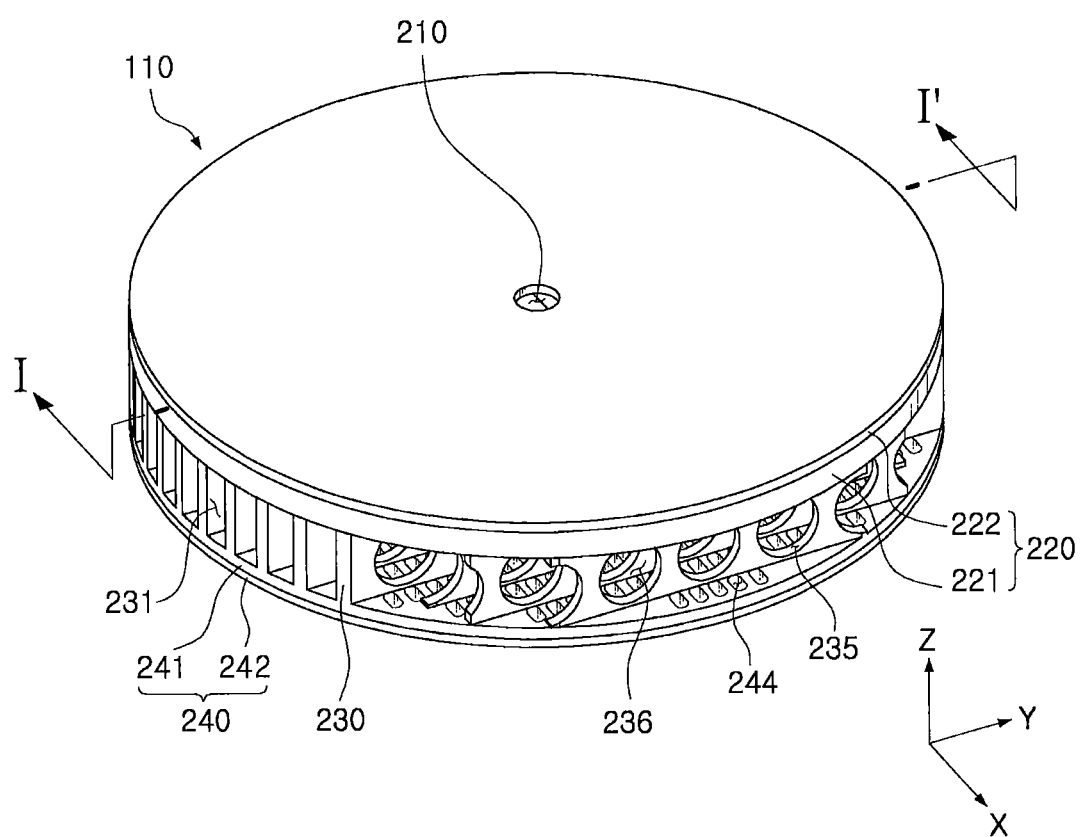
FIG. 2 is a perspective view illustrating a showerhead according to an example embodiment of the present inventive concept.

FIG. 2 is a perspective view illustrating a showerhead according to an example embodiment of the present inventive concept.

Referring to FIG. 2, a showerhead 110 may include an upper plate 220, a lower plate 240, and partition walls 230. The partition walls 230 may be arranged between the upper plate 220 and the lower plate 240 and may contact the upper plate 220 and the lower plate 240.

A gas supply hole 210 may be formed in the center of the upper plate 220 and connected to a gas supply line or pipe for supplying process gas. In FIG. 2, one gas supply hole 210 is illustrated, but the inventive concept is not limited thereto. A plurality of gas supply holes 210 may be formed in the upper plate 220. For example, three gas supply holes 210 may be formed along a main gas supply passage 223 of FIG. 3.

The partition walls 230 may be arranged along a first direction, and may be arranged at regular intervals in a second direction intersecting or perpendicular to the first direction. Spaces between the partition walls 230 may be provided as or define first exhaust passages 231 in the first direction open to or at a side portion of the showerhead 110. Each of the partition walls 230 may have partition wall holes 235 spaced apart from one another at regular intervals. Partition wall holes 235 of adjacent partition walls 230 may overlap or be aligned with each other. The partition wall holes 235 may be arranged in a plurality of rows along the second direction. The overlapping partition wall holes 235 may be provided in or define second exhaust passages 236 in the second direction open to or at the side portion of the showerhead 110. In one example embodiment, the partition walls 230 may not have the partition wall holes 235. The showerhead 110 may have a high thermal uniformity due to the partition walls 230 arranged at regular intervals in the second direction.

The upper plate 220 may include a first upper plate 221 and a second upper plate 222, and the lower plate 240 may include a first lower plate 241 and a second lower plate 242. The first lower plate 241 may include exhaust holes 244. The exhaust holes 244 may be arranged in an area between the partition walls 230 and may be connected (e.g., fluidly connected) to first and second exhaust passages. The exhaust holes 244 may be regularly arranged at a first interval in a first direction and at a second interval in a second direction (e.g., that is perpendicular to the first direction).

Figure 3:
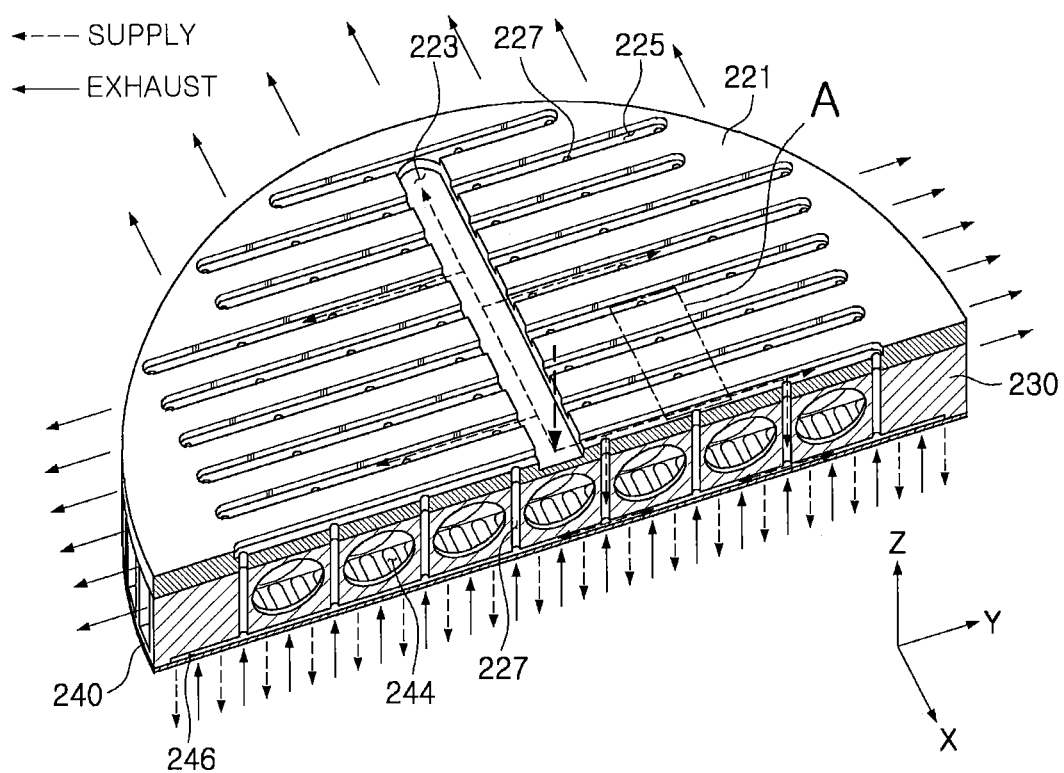
FIGS. 3 and 4 are perspective views illustrating a portion of the showerhead of FIG. 2.
Figure 4:
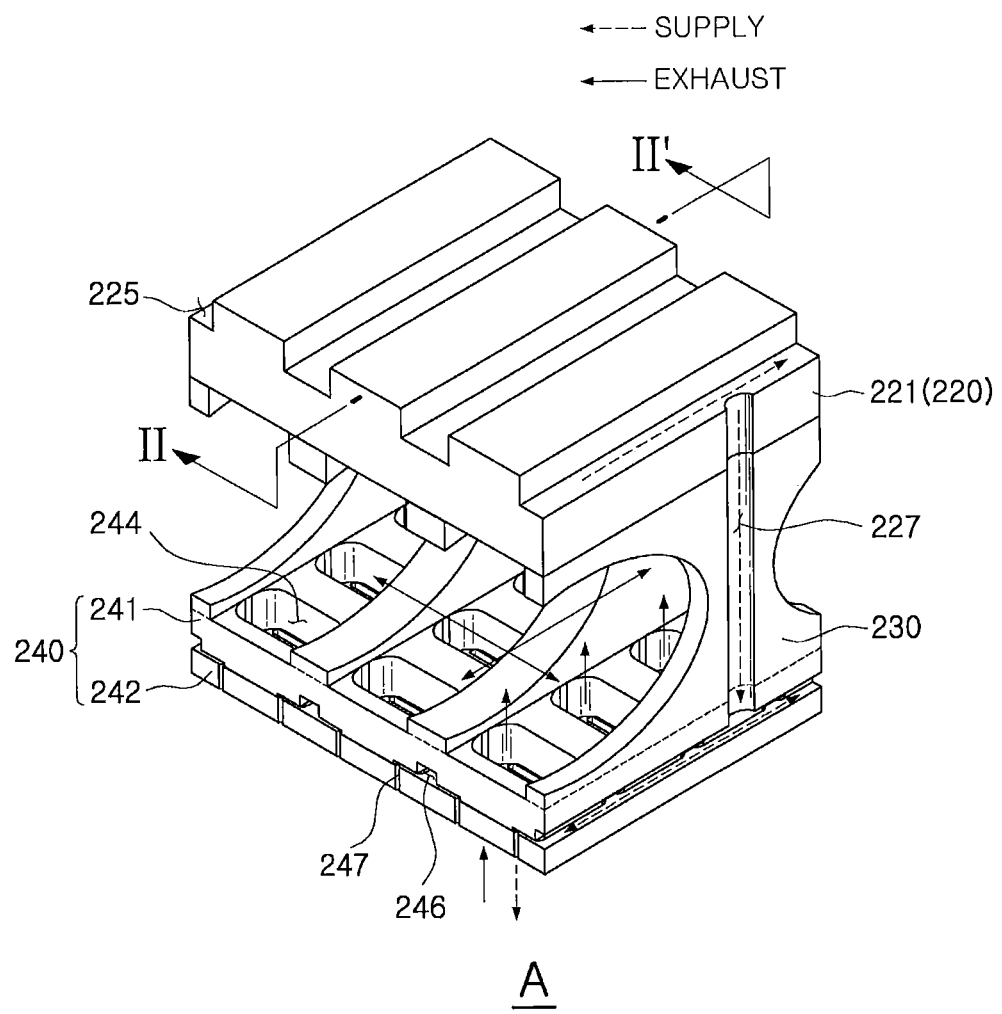

FIGS. 3 and 4 are perspective views illustrating a portion of the showerhead of FIG. 2.

Figure 5:
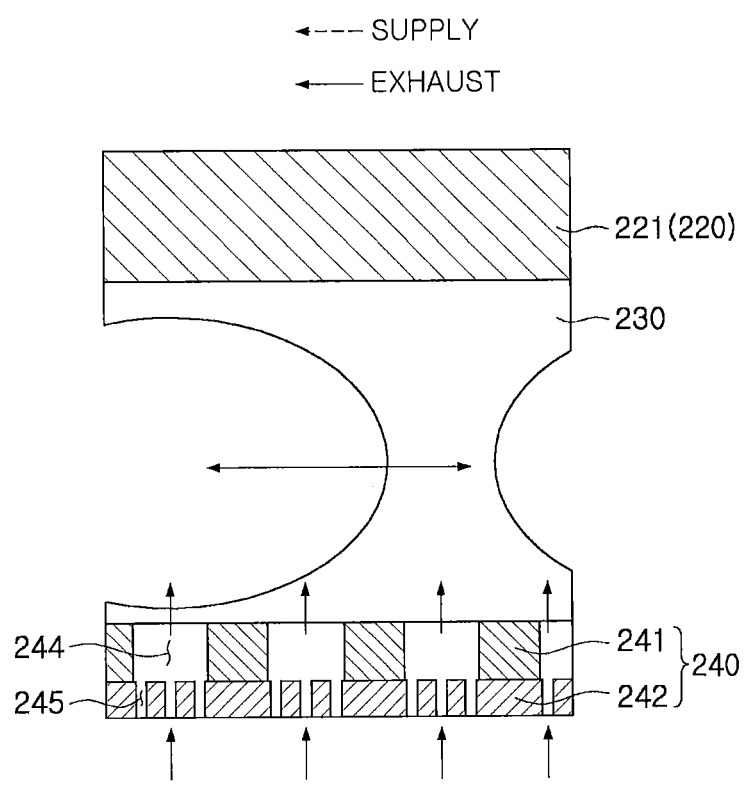
FIG. 5 is a cross-sectional view taken along line II-II' of FIG. 4.

FIG. 3 is a perspective view taken along line I-I' in FIG. 2, and a second upper plate 222 is shown in a state of being removed. FIG. 4 is a perspective view of the 'A' region of FIG. 3. FIG. 5 is a cross-sectional view taken along line II-II' of FIG. 4.

Referring to FIGS. 3, 4 and 5 together, the upper plate 220 may include the first upper plate 221 and the second upper plate 222. The first upper plate 221 may include the main or primary gas supply passage 223 extending in a second direction and sub or secondary gas supply passages 225 extending in a first direction from the main gas supply passage 223 and regularly spaced from the main gas supply passage 223 in the second direction (the first and second directions may be perpendicular to one another). The sub gas supply passages 225 may be arranged in positions overlapping or aligned with the partition walls 230. Vertical supply channels 227 extending vertically from the sub gas supply passages 225 may be formed (e.g., in the partition walls 230). The vertical supply channels 227 may pass through the partition walls 230 and extend to the lower plate 240. The vertical supply channels 227 may be arranged between partition wall holes 235 at regular intervals and may not be connected to the partition walls 230 or the partition wall holes 235.

The vertical supply channels 227 may be connected (e.g., fluidly connected) to horizontal supply channels 246 arranged in the lower plate 240 and extending in the first direction. The horizontal supply channels 246 may be formed on a lower surface of the first lower plate 241 and may be covered or closed off by the second lower plate 242. The horizontal supply channels 246 may be arranged in positions overlapping or aligned with the partition walls 230.

The horizontal supply channels 246 may be connected (e.g., fluidly connected) to supply holes 247 through the second lower plate 242. The supply holes 247 may pass through the second lower plate 242 perpendicular to a lower surface of the second lower plate 242. In one example embodiment, the supply holes 247 may pass through the second lower plate 242 at an angle slanted or sloped relative to the lower surface of the second lower plate 242.

The first lower plate 241 may include exhaust holes 244 and the second lower plate 242 may include exhaust slots or slits 245 connected (e.g., fluidly connected) to the exhaust holes 244. As illustrated, three exhaust slots 245 may be provided for each exhaust hole 244. In other example embodiments, less than three or four or more exhaust slots 245 may be provided for each exhaust hole 244. In one embodiment, the exhaust holes 244 may be connected (e.g., fluidly connected) to first exhaust passages 231 and second exhaust passages 236 provided by the partition walls 230. The exhaust slots 245 may pass through the second lower plate 242 perpendicular to the lower surface of the second lower plate 242. In one example embodiment, the exhaust slots 245 may pass through the second lower plate 242 at an angle slanted or sloped relative to the lower surface of the second lower plate 242.

Figure 6:
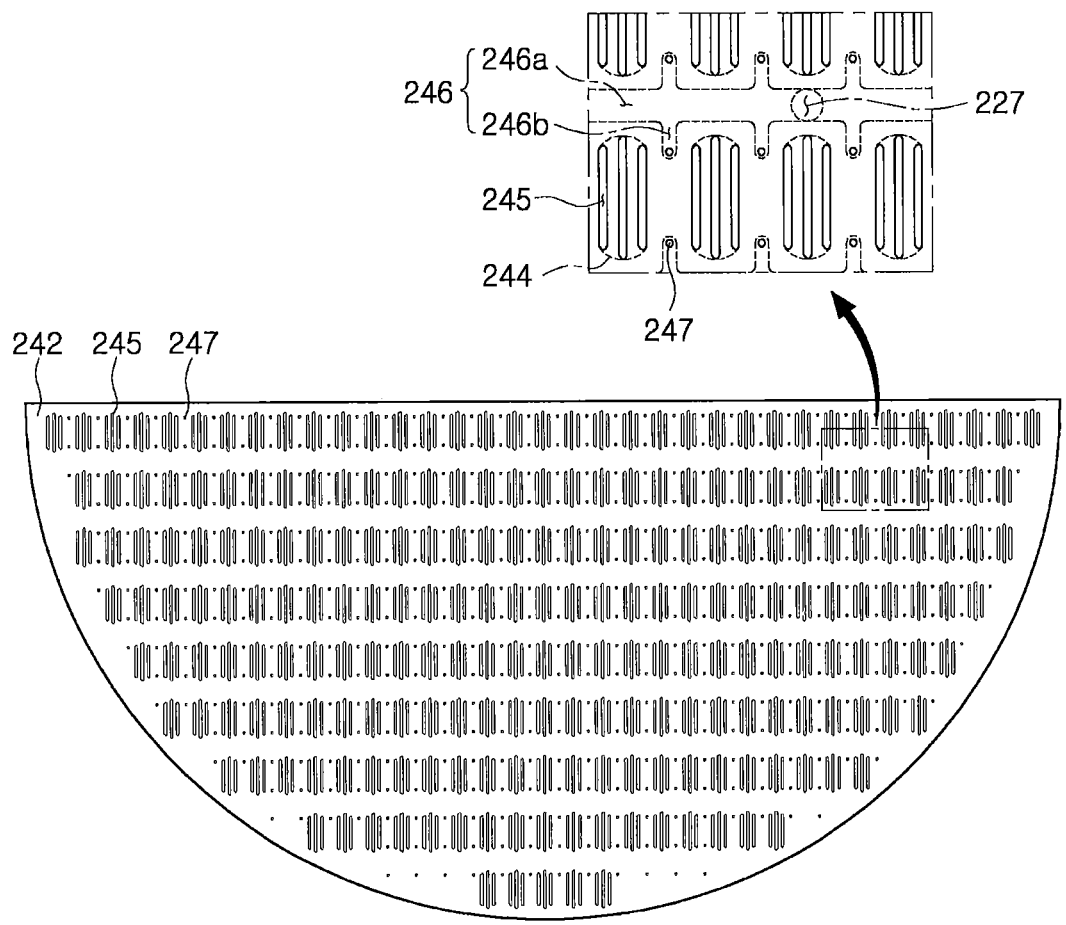
FIG. 6 is a view illustrating a lower surface of a showerhead according to an example embodiment of the present inventive concept.

FIG. 6 is a view illustrating a lower surface of a showerhead according to an example embodiment of the present inventive concept.

Referring to FIG. 6, supply holes 247 and exhaust slots 245 may be regularly arranged on a lower surface of the lower plate 240, for example, on a lower surface of the second lower plate 242. Three exhaust slots 245 may constitute a first repeating unit and two supply holes 247 may constitute a second repeating unit. The first repeating units and the second repeating units may be alternately arranged in the first direction. In the second direction, the first repeating units may be repeatedly arranged at regular intervals and the second repeating units may be repeatedly arranged at regular intervals. In example embodiments, a single exhaust slot 245 may constitute a first repeating unit, or two exhaust slots 245 may constitute a first repeating unit. In one example embodiment, four or more exhaust slots 245 may constitute a first repeating unit. The total area of the exhaust slots 245 may be greater than the total area of the supply holes 247.

Referring to a partially enlarged view of FIG. 6, horizontal supply channels 246 may include a first horizontal supply channel 246a extending in the first direction, and a second horizontal supply channel 246b (or a plurality of second horizontal supply channels 246b) extending in the second direction from the first horizontal supply channel 246a. The second horizontal supply channel 246b may be disposed on or extend from both side surfaces of the first horizontal supply channel 246a and may be perpendicular to the first horizontal supply channel 246a. The second horizontal supply channels 246b may extend between exhaust holes 244. The second horizontal supply channel 246b may have a length shorter than that of the first horizontal supply channel 246a.

Three exhaust slots 245 may be arranged to overlap or align with one exhaust hole 244. The supply holes 247 may be arranged to overlap or align with the second horizontal supply channel 246b of the horizontal supply channels 246.

When etching a layer on a substrate W with the substrate processing apparatus 100 of the present inventive concept, etching gas may be supplied to the plasma confining region from a lower surface of the showerhead 110, through the main gas supply passage 223, the sub gas supply passage 225, the vertical supply channel 227, the horizontal supply channel 246, and the supply hole 247. The supplied etching gas may form a plasma, and the layer on the substrate W may be etched by positive ions (etching ions) of the plasma. For example, the layer to be etched may be a laminated structure in which a silicon oxide layer and a silicon nitride layer are alternately laminated.

Meanwhile, residual gas including plasma radicals, neutral atoms, etch by-products, and the like may be exhausted to the plasma processing chamber from a side portion of the showerhead 110 through exhaust slits 245, exhaust holes 244, and exhaust passages in the showerhead 110. The exhausted residual gas may be externally discharged through the exhaust port 145 disposed in a lower portion of the chamber wall 140 (referring to FIG. 1).

Conventionally, openings may be formed in a lower portion of a C-shaped shroud to allow residual gas to flow out through the lower portion of the C-shaped shroud. In this case, residual gases may flow horizontally in a plasma confining region, and may be exhausted through the openings. The horizontal flow of the residual gas may affect a vertical movement of the etching ions. For example, horizontal movement components of the etching ions may be increased. In-wafer uniformity of the etching process may be deteriorated due to the horizontal flow of the residual gas.

In an example embodiment of the present inventive concept, residual gas, such as radicals and neutral atoms, may not flow horizontally in the plasma confining region, but may be introduced to the showerhead 110 again in a vertical direction and then be exhausted to the plasma processing chamber from the side portion of the showerhead 110.

Accordingly, the showerhead 110 according to an example embodiment may suppress the horizontal flow of the residual gas, thereby improving the in-wafer uniformity of the etching process.

Figure 7:
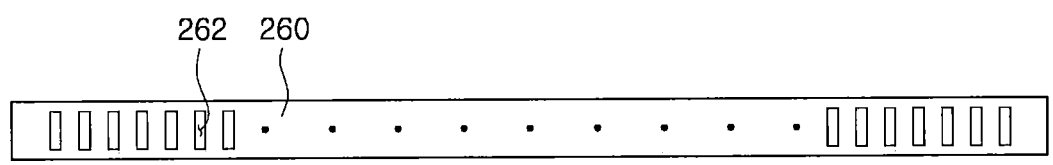
FIG. 7 is a view illustrating a baffle that may be mounted on a showerhead according to an example embodiment of the present inventive concept.

FIG. 7 is a view illustrating a baffle that may be mounted on a showerhead according to an example embodiment of the present inventive concept.

Referring to FIG. 7, a showerhead 110 may further include baffles 260 having baffle holes 262 arranged at regular intervals. The baffles 260 may be inserted between partition walls 230, and may be arranged so that the baffle holes 262 are inconsistent with or not aligned with exhaust slots 245. The baffles 260 may be inserted between partition walls 230 while keeping a predetermined distance from an upper surface of a first lower plate 241. The baffles 260 may have different lengths, depending on positions in which they are inserted. The baffles 260 may be inserted to prevent or reduce a secondary discharge from occurring in exhaust passages of the showerhead 100.

Figure 8:
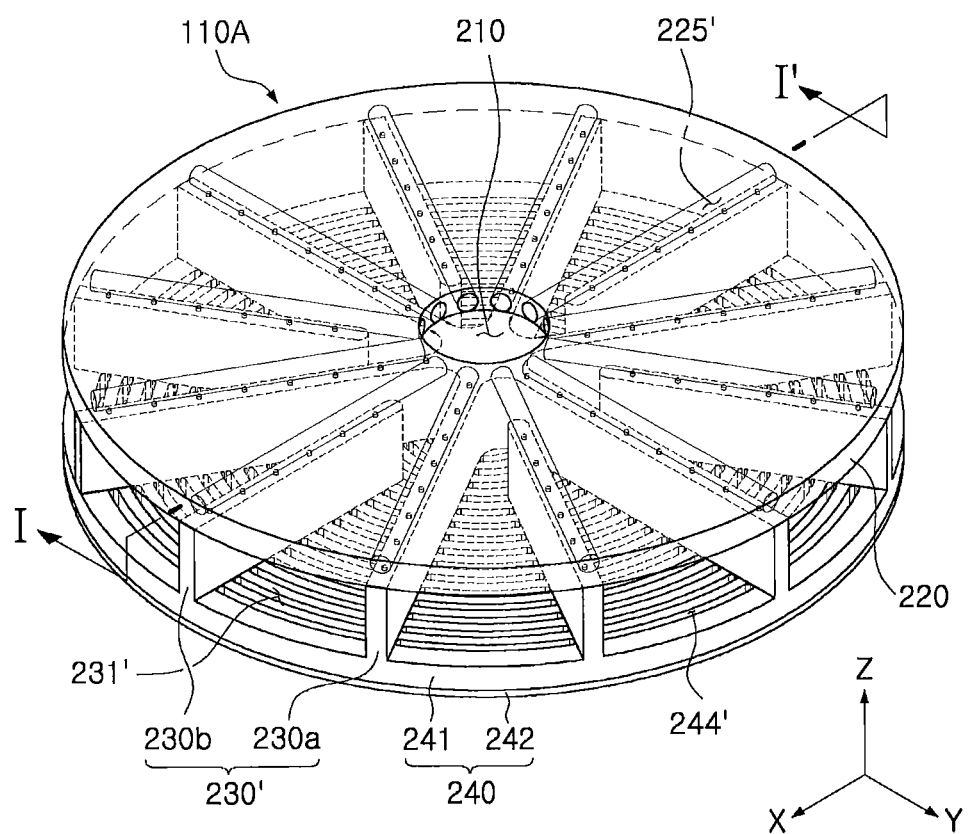
FIG. 8 is a perspective view illustrating a showerhead according to an example embodiment of the present inventive concept.

FIG. 8 is a perspective view illustrating a showerhead according to an example embodiment of the present inventive concept.

Referring to FIG. 8, a showerhead 110A may include an upper plate 220, a lower plate 240, and partition walls 230'. The partition walls 230' may be arranged between the upper plate 220 and the lower plate 240 and may contact the upper plate 220 and the lower plate 240.

A gas supply hole 210 may be formed in the center of the upper plate 220 and may be connected to a gas supply line or pipe for supplying process gas. The upper plate 220 may include gas supply passages 225' arranged radially and connected (e.g., fluidly connected) to the gas supply hole 210. The gas supply passages 225' may be arranged at regular angles. The angles between the gas supply passages 225' may be 60 degrees. In example embodiments, the angles between the gas supply passages 225' may be, for example, 15 degrees, 30 degrees, 45 degrees, 90 degrees, and the like.

The partition walls 230' may include first partition walls 230a and second partition walls 230b each arranged radially. The partition walls 230' may extend radially outwardly from a central portion of each of the upper plate 220 and the lower plate 240. The second partition walls 230b may be arranged between the first partition walls 230a and may have a shorter length than the first partition walls 230a. In one embodiment, two or more of second partition walls 230b may be arranged between the first partition walls 230a. The second partition walls 230b may not contact the first partition walls 230a. In one example embodiment, the second partition walls 230b may have the same length as the first partition walls 230a and may contact the first partition walls 230a. The partition walls 230' may be arranged at regular angles. The angles between the partition walls 230' may be 60 degrees. In example embodiments, the angles between the partition walls 230' may be, for example, 15 degrees, 30 degrees, 45 degrees, 90 degrees, and the like. The partition walls 230' may be arranged in positions overlapping or aligned with the gas supply passages 225'. The showerhead 110A may have a high thermal uniformity due to the partition walls 230' being arranged at regular angles.

Spaces between the partition walls 230' may be provided as exhaust passages 231' open to or at a side portion of the showerhead 110A. The lower plate 240 may include a first lower plate 241 and a second lower plate 242. The first lower plate 241 may include exhaust holes 244'. The exhaust holes 244' may be arranged in an area between the partition walls 230' and may be connected (e.g., fluidly connected) to the exhaust passages 231'. The exhaust holes 244' may be arranged on or along a plurality of concentric circles at regular intervals (e.g., the exhaust holes 244' may be arranged concentrically).

Figure 9:
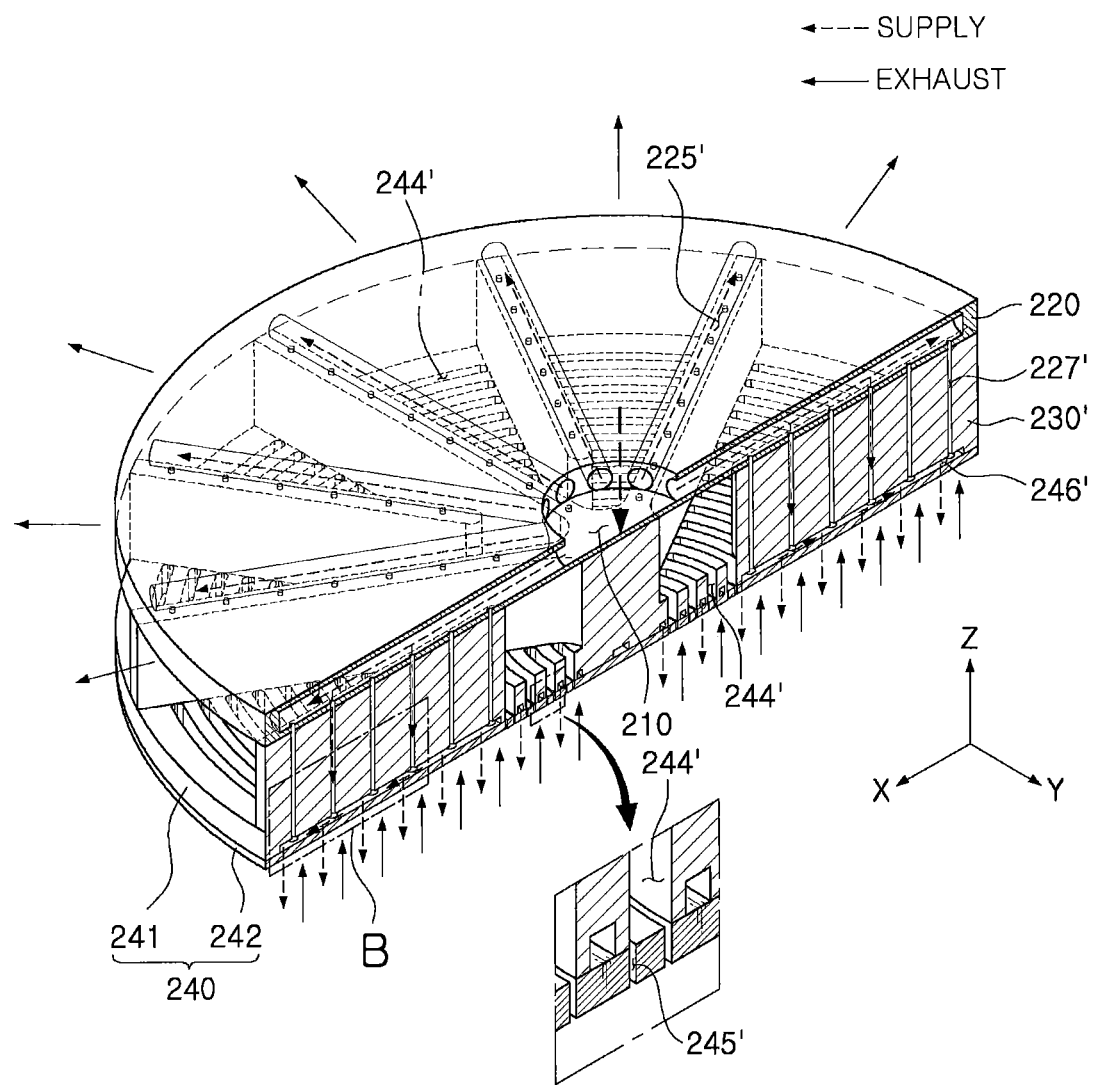
FIGS. 9 and 10 are perspective views illustrating a portion of the showerhead of FIG. 8.
Figure 10:
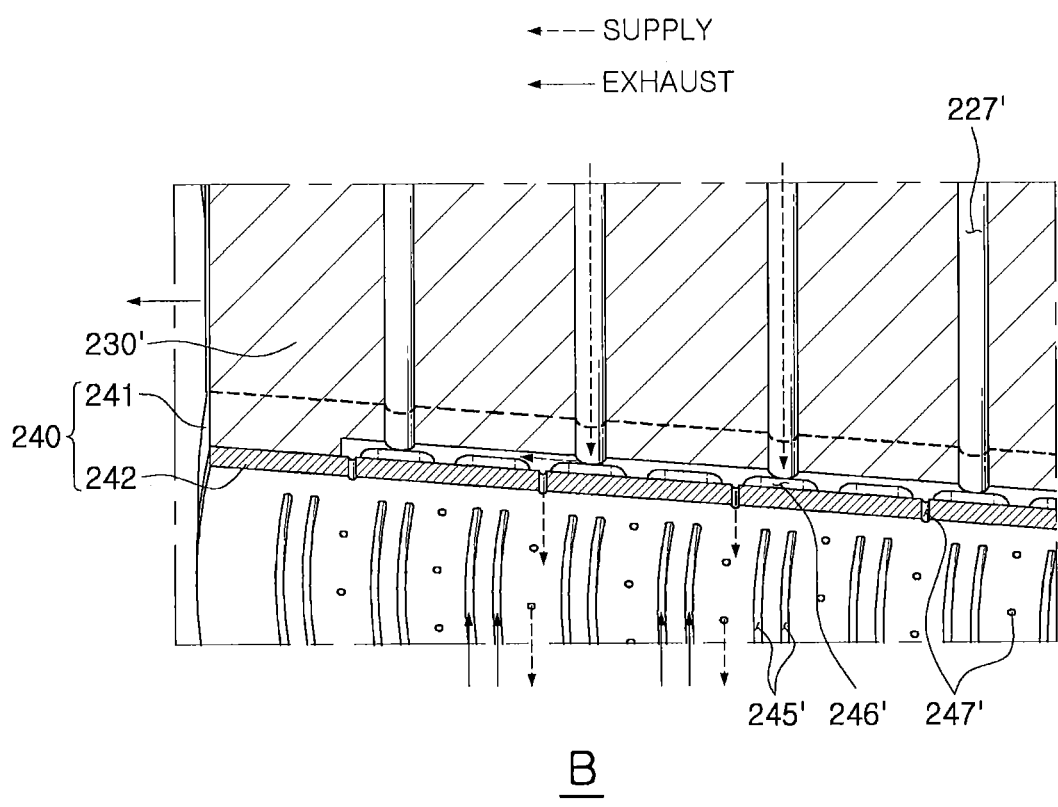

FIGS. 9 and 10 are perspective views illustrating a portion of the showerhead of FIG. 8.

Referring to FIGS. 9 and 10, gas supply passages 225' may be arranged in positions overlapping or aligned with partition walls 230'. Vertical supply channels 227' extending vertically from the gas supply passages 225' may be formed. The vertical supply channels 227' may pass through the partition walls 230' and extend to the lower plate 240. The vertical supply channels 227' may be arranged at regular intervals along the partition walls 230'.

The vertical supply channels 227' may be connected (e.g., fluidly connected) to horizontal supply channels 246' arranged in the lower plate 240. The horizontal supply channels 246' may be formed on a lower surface of the first lower plate 241 and covered or closed off by the second lower plate 242. The horizontal supply channels 246' may include portions overlapping or aligned with the partition walls 230'.

The horizontal supply channels 246' may be connected (e.g., fluidly connected) to supply holes 247' penetrating the second lower plate 242. The supply holes 247' may pass through the second lower plate 242 perpendicular to a lower surface of the second lower plate 242. In one example embodiment, the supply holes 247' may pass through the second lower plate 242 at an angle slanted or sloped relative to the lower surface of the second lower plate 242.

The first lower plate 241 may include exhaust holes 244' and the second lower plate 242 may include exhaust slots 245' coupled (or fluidly connected) to exhaust holes 244'. As illustrated, two exhaust slots 245' may be provided for each exhaust hole 244'. In example embodiments, 1 or 3 or more of the exhaust slots 245' may be provided for each exhaust hole 244'. The exhaust holes 244' may be connected (e.g., fluidly connected) to the exhaust passages 231' provided by the partition walls 230'. The exhaust slots 245' may pass through the second lower plate 242 perpendicular to the lower surface of the second lower plate 242. In one embodiment, the exhaust slots 245' may pass through the second lower plate 242 at an angle slanted or sloped relative to the lower surface of the second lower plate 242.

Figure 11:
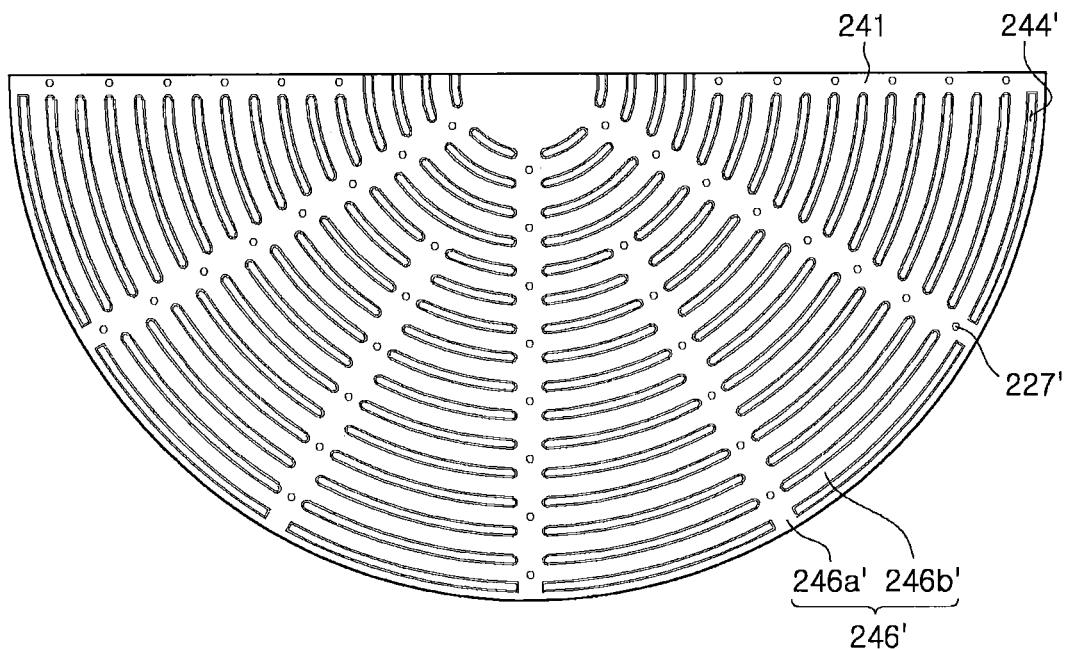
FIG. 11 is a view illustrating exhaust holes and horizontal supply channels of a showerhead according to an example embodiment of the present inventive concept.

FIG. 11 is a view illustrating exhaust holes and horizontal supply channels of a showerhead according to an example embodiment of the present inventive concept. FIG. 11 may show a lower surface of the first lower plate 241 in the lower plate 240 of the showerhead 110A.

Referring to FIG. 11, the first lower plate 241 may include exhaust holes 244' and horizontal supply channels 246'. The exhaust holes 244' may pass through the first lower plate 241 and the horizontal supply channels 246' may be formed on a lower surface of the first lower plate 241. The horizontal supply channels 246' may be grooves having a predetermined depth.

The exhaust holes 244' may be arranged on or along concentric circles at regular intervals and may extend in a circumferential direction along the concentric circles (e.g., the exhaust holes 244' may be arranged concentrically). The horizontal supply channels 246' may include first horizontal supply channels 246a' arranged radially and second horizontal supply channels 246b' extending from the first horizontal supply channels 246a' and arranged on or along concentric circles at regular intervals (e.g., the second horizontal supply channels 246b' may be arranged concentrically). The second horizontal supply channels 246b' may extend between the exhaust holes 244'. The horizontal supply channels 246' or the second horizontal supply channels 246b' may be connected (e.g., fluidly connected) to the first horizontal supply channels 246a'.

Figure 12:
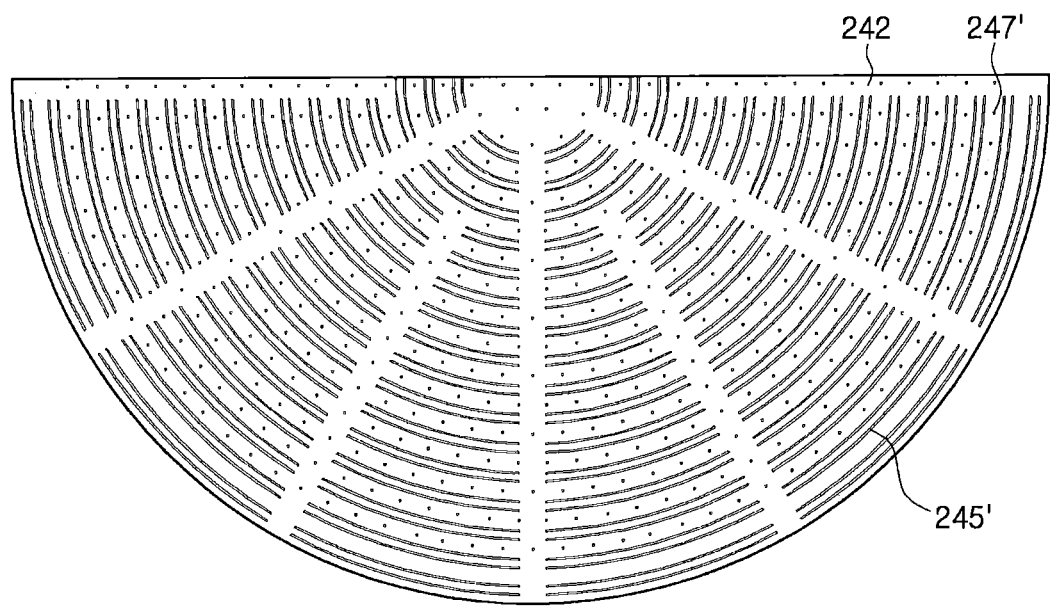
FIG. 12 is a view illustrating supply holes and exhaust slots of a showerhead according to an example embodiment of the present inventive concept.

FIG. 12 is a view illustrating supply holes and exhaust slots of a showerhead according to an example embodiment of the present inventive concept. FIG. 12 shows a lower surface of the second lower plate 242 in the lower plate 240 of a showerhead 110A.

Referring to FIG. 12, the second lower plate 242 may include exhaust slits 245' and supply holes 247'. The exhaust slits 245' and the supply holes 247' may pass through the second lower plate 242.

The exhaust slits 245' and the supply holes 247' may be arranged on or along concentric circles at regular intervals and may be arranged alternately in a radial direction (e.g., the exhaust slits 245' and the supply holes 247' may be arranged concentrically).

The exhaust slits 245' may be arranged on or along concentric circles at regular intervals and extend in a circumferential direction along the concentric circles. The exhaust slits 245' may be arranged to overlap or align with the exhaust holes 244' in FIG. 11. A pair of the exhaust slits 245' may be provided for each of the exhaust holes 244', but the inventive concept is not limited thereto.

The supply holes 247' may be arranged on or along concentric circles at regular intervals. The supply holes 247' may be arranged at regular intervals along a circumferential direction. The supply holes 247' may be arranged to overlap or align with the horizontal supply channels 246' of FIG. 11.

The total area of the exhaust slots 245' may be greater than the total area of the supply holes 247'.

The showerhead 110A according to an embodiment may suppress horizontal flow of residual gas, and thereby improve in-wafer uniformity of an etching process.

Figure 13:
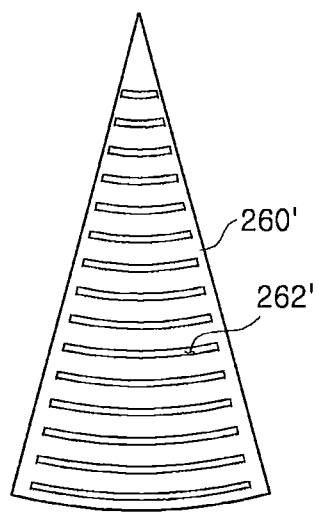
FIG. 13 is a view illustrating a baffle that may be mounted on a showerhead according to an example embodiment of the present inventive concept.

FIG. 13 is a view illustrating a baffle that may be mounted on a showerhead according to an embodiment of the present inventive concept.

Referring to FIG. 13, a showerhead 100A may further include a baffle 260' having baffle holes 262' arranged on or along concentric circles at regular intervals. The baffle 260' may be inserted between partition walls 230', and may be disposed so that the baffle holes 262' are inconsistent or not aligned with exhaust slots 245'. The baffle holes 262' may have different lengths. The baffles 260' may be inserted between partition walls 230' while keeping a predetermined distance from an upper surface of a first lower plate 241. The baffles 260' may have a fan shape. The baffles 260' may be inserted between the partition walls 230' to prevent or reduce a secondary discharge from occurring in exhaust passages of the showerhead 100A.

According to an embodiment of the present inventive concept, a showerhead and a substrate processing apparatus may be provided in which uniformity in a wafer in processing operations is improved.

The various and advantageous advantages and effects of the present inventive concept are not limited to the above description, and can be more easily understood in the course of describing a specific embodiment of the present inventive concept.

While example embodiments have been shown and described above, it will be apparent to those skilled in the art that modifications and variations could be made without departing from the scope of the present inventive concept as defined by the appended claims.

What is claimed is:

1. A showerhead for use in a substrate processing apparatus, the showerhead comprising:
   an upper plate including a plurality of gas supply passages;
   a lower plate including a plurality of supply holes and a plurality of exhaust slots defined in a lower surface thereof; and
   a plurality of partition walls between the upper plate and the lower plate and defining exhaust passages that are open at a side portion of the showerhead.

2. The showerhead according to claim 1, wherein the plurality of partition walls include a plurality of vertical supply channels fluidly connected to the plurality of gas supply passages of the upper plate and the plurality of supply holes of the lower plate.

3. The showerhead according to claim 2, wherein the lower plate includes a first lower plate including a plurality of first horizontal supply channels vertically aligned with the plurality of partition walls and connected to the plurality of vertical supply channels and a plurality of second horizontal supply channels connected to the plurality of first horizontal supply channels, and a second lower plate covering a lower surface of the first lower plate and having the plurality of supply holes extending therethrough, wherein the plurality of supply holes are connected to the plurality of second horizontal supply channels.

4. The showerhead according to claim 1, wherein the plurality of partition walls extend in a first direction parallel to one another and are spaced apart from one another at regular intervals.

5. The showerhead according to claim 4, wherein each of the plurality of partition walls includes a plurality of partition wall holes arranged at regular intervals, and wherein the plurality of partition wall holes of adjacent ones of the plurality of partition walls are aligned with each other.

6. The showerhead according to claim 4, wherein the plurality of supply holes and the plurality of exhaust slots are alternately arranged on the lower plate in the first direction, and the plurality of supply holes and the plurality of exhaust slots are each repeatedly arranged on the lower plate in a second direction, that is perpendicular to the first direction.

7. The showerhead according to claim 1, wherein the plurality of partition walls include a plurality of first partition walls and a plurality of second partition walls extending radially outwardly from a central portion of each of the upper plate and the lower plate, and wherein each of the plurality of second partition walls is between a pair of the plurality of first partition walls, and each of the plurality of second partition walls has a length shorter than that of each of the plurality of first partition walls.

8. The showerhead according to claim 7, wherein the plurality of supply holes and the plurality of exhaust slots are each arranged along a plurality of concentric circles on the lower plate at regular intervals and are alternately arranged in a radial direction on the lower plate.

9. The showerhead according to claim 1, wherein a total area of the plurality of exhaust slots on the lower plate is larger than a total area of the plurality of supply holes on the lower plate.

10. The showerhead according to claim 1, further comprising a plurality of baffles inserted between the plurality of partition walls and including a plurality of baffle holes that are offset from the plurality of exhaust slots.

11. A showerhead for use in a substrate processing apparatus, the showerhead comprising:
    an upper plate including a plurality of gas supply passages;
    a lower plate including a plurality of supply holes and a plurality of exhaust slots defined in a lower surface thereof; and
    a plurality of partition walls between the upper plate and the lower plate and vertically aligned with the plurality of gas supply passages, the plurality of partition walls defining exhaust passages that are open at an outer side of the showerhead;
    wherein the plurality of partition walls include a plurality of vertical supply channels fluidly connected to the plurality of gas supply passages of the upper plate and the plurality of supply holes of the lower plate; and
    wherein a total area of the plurality of exhaust slots is larger than a total area of the plurality of supply holes on the lower surface of the lower plate.

12. The showerhead according to claim 11, wherein the plurality of partition walls extend in a first direction parallel to one another and are spaced apart from one another at regular intervals.

13. The showerhead according to claim 12, wherein each of the plurality of partition walls includes a plurality of partition wall holes arranged at regular intervals, wherein the plurality of partition wall holes of adjacent ones of the plurality of partition walls are aligned with each other.

14. The showerhead according to claim 12, wherein the plurality of supply holes and the plurality of exhaust slots are alternately arranged on the lower surface of the lower plate in the first direction, and the plurality of supply holes and the plurality of exhaust slots are each repeatedly arranged on the lower surface of the lower plate in a second direction that is perpendicular to the first direction.

15. The showerhead according to claim 11, wherein the plurality of partition walls include a plurality of first partition walls and a plurality of second partition walls extending radially outwardly from a central portion of each of the upper plate and the lower plate, wherein the plurality of first partition walls and the plurality of second partition walls are alternately arranged in a circumferential direction, and wherein each of the plurality of second partition walls have a length shorter than that of each of the plurality of first partition walls.

16. The showerhead according to claim 15, wherein the plurality of supply holes and the plurality of exhaust slots are arranged along a plurality of concentric circles on the lower surface of the lower plate at regular intervals and are alternately arranged in a radial direction on the lower surface of the lower plate.

* * * * *